(12) United States Patent
Easton et al.

(10) Patent No.: US 10,219,403 B2
(45) Date of Patent: Feb. 26, 2019

(54) STRUCTURAL ELECTRICAL GROUNDING FOR DATA MANAGEMENT SYSTEMS AND RELATED METHODS

(71) Applicant: Seagate Technology LLC, Cupertino, CA (US)

(72) Inventors: Michael J. Easton, Salisbury (GB); James Goddard, Portsmouth (GB); Anthony J. Foot, Romsey (GB)

(73) Assignee: Seagate Technology LLC, Cupertino, CA (US)

( * ) Notice: Subject to any disclaimer, the term of this patent is extended or adjusted under 35 U.S.C. 154(b) by 245 days.

(21) Appl. No.: 15/188,251

(22) Filed: Jun. 21, 2016

(65) Prior Publication Data

US 2017/0367211 A1    Dec. 21, 2017

(51) Int. Cl.
| | |
|---|---|
| *H05K 7/14* | (2006.01) |
| *G06F 1/18* | (2006.01) |
| *H05K 5/04* | (2006.01) |
| *H05K 5/00* | (2006.01) |
| *H05K 7/18* | (2006.01) |
| *H05K 7/20* | (2006.01) |

(52) U.S. Cl.
CPC ........... *H05K 7/1492* (2013.01); *G06F 1/189* (2013.01); *H05K 5/0021* (2013.01); *H05K 5/04* (2013.01); *H05K 7/1489* (2013.01); *H05K 7/183* (2013.01); *H05K 7/20736* (2013.01)

(58) Field of Classification Search
CPC ...... H05K 7/1492; H05K 5/0021; H05K 5/04; H05K 7/1489; H05K 7/183; H05K 7/20736
See application file for complete search history.

(56) References Cited

U.S. PATENT DOCUMENTS

| | | | |
|---|---|---|---|
| 1,946,862 A | 2/1934 | Koch, Jr. | |
| 6,347,043 B1 | 2/2002 | Natarajan et al. | |
| 2006/0198594 A1 | 9/2006 | Beck | |
| 2008/0025682 A1 | 1/2008 | Barnes | |
| 2008/0144293 A1* | 6/2008 | Aksamit | H05K 7/1489 361/727 |
| 2009/0034181 A1* | 2/2009 | Gizycki | H01R 13/652 361/679.02 |
| 2013/0175988 A1 | 7/2013 | Ghabbour et al. | |

* cited by examiner

*Primary Examiner* — Robert J Hoffberg
*Assistant Examiner* — Hung Dang
(74) *Attorney, Agent, or Firm* — Mueting, Raasch & Gebhardt, P.A.

(57) ABSTRACT

A data management system includes a chassis metalwork that is electrically conductive. The chassis metalwork is electrically coupled to the power supply to form a return power path. The return power path may include a sub-chassis frame and a drawer frame. The return power path may also include uninsulated return power cables. The return power cables may be maintained in a cable chain along with outgoing power cables and data cables. The return power cables may be coupled to the drawer frame and the sub-chassis frame.

18 Claims, 9 Drawing Sheets

STRUCTURAL ELECTRICAL GROUNDING FOR DATA MANAGEMENT SYSTEMS AND RELATED METHODS

The disclosure herein relates to data management systems, and in particular, an electrical grounding structure providing a space-saving return power path to a power supply in a data management system.

SUMMARY

It would be desirable to develop a power delivery system for data management systems that facilitates more storage density and more access bandwidth. In illustrative embodiments of the present disclosure, a data management system includes conductive material (e.g., metalwork) that provides structural support to components and also provides a return path for power from a power supply. Data management systems may include a sub-chassis and a drawer, each including a conductive metal frame. In some embodiments, the frames may be physically coupled to each other via a housing structure and electrically coupled via a cable structure. In other embodiments, the frames are physically and electrically coupled via the same structure.

In at least one illustrative embodiment, a system according to the present disclosure includes a sub-chassis having an electrically-conductive sub-chassis frame. The system further includes a drawer frame being electrically conductive and mechanically coupled to the sub-chassis. The system also includes a first power supply fixedly coupled relative to the sub-chassis having a first terminal and a second terminal. The first power supply is configured to drive a current via the first and second terminals to provide electrical power to an active device disposed in the drawer frame. Still further, the system includes first power cable being electrically coupled to the first terminal of the first power supply via the sub-chassis frame and being electrically coupled to the active device via the drawer frame.

In at least an additional embodiment, a system according to the present disclosure includes an active device having a first power connection and a second power connection. The system further includes a drawer frame being electrically conductive and electrically coupled to the first power connection of the active device at a first connection on the drawer frame. In addition, the system includes a power cable being electrically coupled to the drawer frame at a second connection on the drawer frame different than the first connection. Further still, the system includes a sub-chassis having an electrically-conductive sub-chassis frame electrically coupled to the first power cable and a backplane having a backplane electrical conductor electrically coupled to the sub-chassis frame. Also, the system includes a power supply having a first terminal and a second terminal to deliver electrical power. The first terminal is electrically coupled to the backplane electrical conductor and a second terminal. The second terminal is electrically coupled to the second power connection of the active device.

In some embodiments, the power cable may be rated to carry at least about 100 amperes of current when in use.

In various embodiments, the power cable may be uninsulated.

In at least one further embodiment, a method includes electrically coupling an electrically conductive frame of a chassis to a first terminal of a power supply. The chassis includes a front portion and a rear portion. The power supply is disposed in the rear portion. The power supply is configured to drive a current via the first terminal and a second terminal to provide electrical power. The method also includes electrically coupling a first power connection of an active device to the first terminal of the power supply via the frame. The active device includes at least one of a server and a storage device. The active device is disposed in the front portion of the chassis. The method further includes electrically coupling a second power connection of the active device to the second terminal of the power supply via a power cable.

In some embodiments, the frame is electrically coupled to an earth ground.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE DRAWINGS

The accompanying drawings are included to provide a further understanding of the subject matter of the present disclosure, and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative, and are not intended to limit the scope of the claims in any manner.

DETAILED DESCRIPTION

Figure 1:
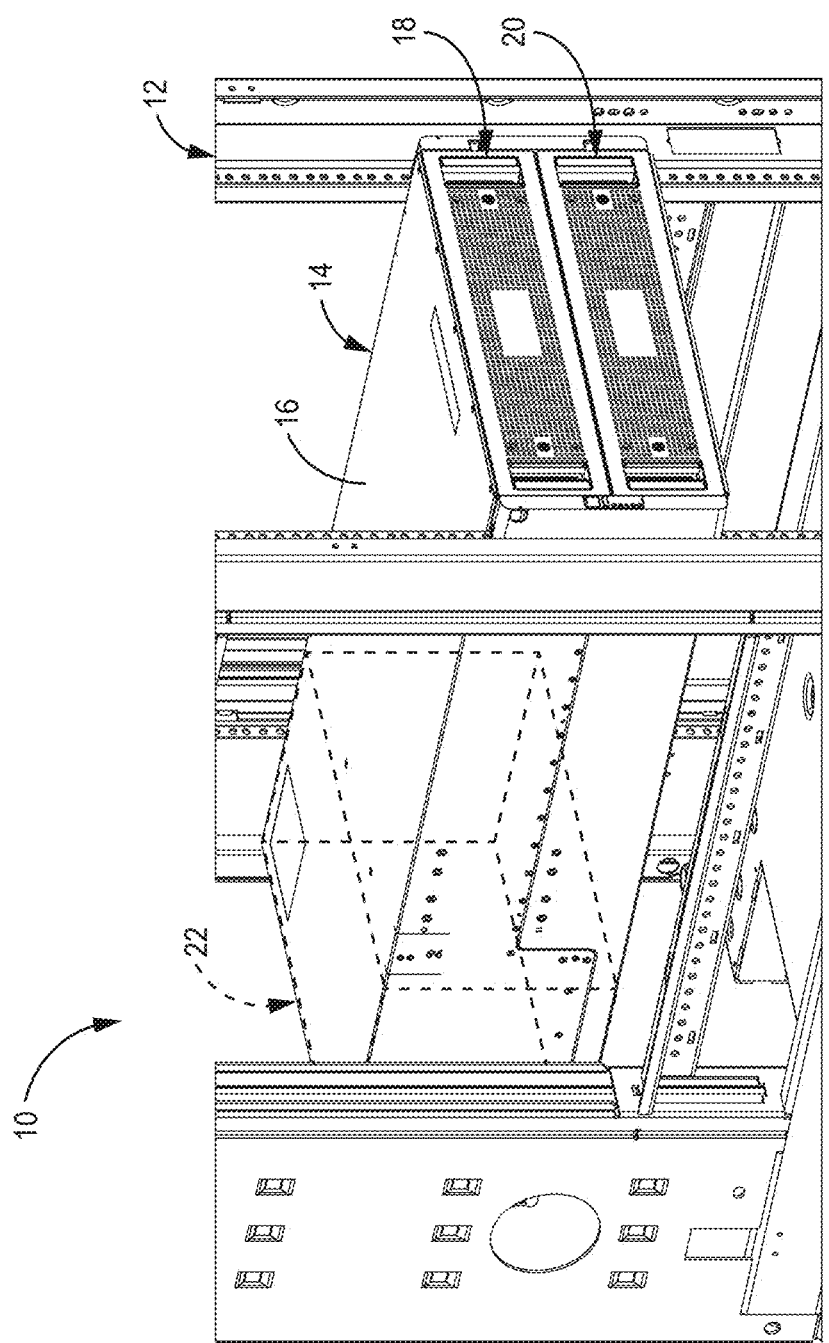
FIG. 1 is a front-overhead perspective view of a data management system including a chassis mounted in a rack according to at least one illustrative embodiment of the present disclosure.

Data management systems may include storage devices and servers, for example, and be connected to a network for convenient access. The popularity of cloud networks for the storage of data has increased the demand for higher storage densities while simultaneously improving access bandwidth. It may be desirable to provide higher storage density systems in higher bandwidth systems.

One desirable feature for data management systems is the ability to swap, add, or remove active devices, such as individual storage devices or servers, in a rack unit without interrupting access to other components in the rack unit (e.g., a hot swap). In some systems, a rack may include a sub-chassis and a drawer containing the active devices. To physically access the active devices, the drawer may be slidably coupled to the sub-chassis. In some cases, the drawer may be closed and disposed in the chassis housing during normal operation. When a device in the drawer needs maintenance, for example, the drawer may be pulled out by a user to access the device to perform the necessary tasks. Preferably, other devices in the drawer remain active and operational during the process. It may be desirable to provide robust power and data connections to the devices to the drawer.

In the following detailed description, reference is made to several specific embodiments. It is to be understood that other embodiments are contemplated and may be made without departing from the scope or spirit of the present disclosure. The following detailed description, therefore, is not to be taken in a limiting sense.

The disclosure herein relates to data management systems, and in particular, an electrical grounding structure providing a space-saving return power path to a power supply in a data management system. The available space may be used for improving storage density and bandwidth of the data management system while maintaining a robust, operable connection between the active devices and the power supply.

All scientific and technical terms used herein have meanings commonly used in the art unless otherwise specified. The definitions provided herein are to facilitate understanding of certain terms used frequently herein and are not meant to limit the scope of the present disclosure.

As used herein, the terms "coupled" and "connected" are generally interchangeable and generally refer to elements being mechanically attached to each other directly (in direct contact with each other) or indirectly (having one or more elements between and attaching the two elements).

Also, as used herein, the term "operably coupled" refers to components that are capable of interacting with one another to perform one or more functions. In particular, components "operably coupled" to deliver electrical power may include an electrical, electronic, electromagnetic, or any coupling or any combinations thereof suitable for delivering electrical power between said components, for example.

Further, as used herein, the term "electrically coupled" refers to operably coupled components that are capable of interacting with one another via electrons in a circuit. In particular, components "electrically coupled" together may have electric conductors, resistors, capacitors, inductors, electronic components, or any similar components or any combinations thereof, for example, between said components to form the electrical coupling.

The present disclosure describes systems in which the conductive material (e.g., metalwork) in the sub-chassis and drawer provide a return power path to a power supply. For example, the power supply may be connected to the active devices via an outgoing power path, and the metalwork providing structural support to the chassis may also provide a common return power path from a plurality of active devices in a drawer back to the power supply.

The use of such metalwork facilitates additional space savings in the system. The system may include uninsulated return power cabling, which may electrically couple the sub-chassis and drawer, for example, because the return power cables need not be electrically isolated from each other. Furthermore, the outgoing power cabling may be designed with a reduced diameter. Because the use of the metalwork provides a lower resistance return power path than typical return path cabling, the outgoing power cabling can be reduced in diameter while still meeting the voltage drop requirements at the active devices. Accordingly, systems of the present disclosure are designed to facilitate increased storage density and higher bandwidth (e.g., faster speeds) while maintaining robust power and data connections to the active devices, as compared to systems using only return power cabling, for example, because the additional space savings can be used for additional data connection cabling or additional storage.

Reference will now be made to the drawings, which depict one or more aspects described in this disclosure. However, it will be understood that other aspects not depicted in the drawings fall within the scope and spirit of this disclosure. Like numbers used in the figures refer to like components, steps and the like. However, it will be understood that the use of a number to refer to a component in a given figure is not intended to limit the component in another figure labeled with the same number. In addition, the use of different numbers to refer to components in different figures is not intended to indicate that the different numbered components cannot be the same or similar to other numbered components.

Figure 2:
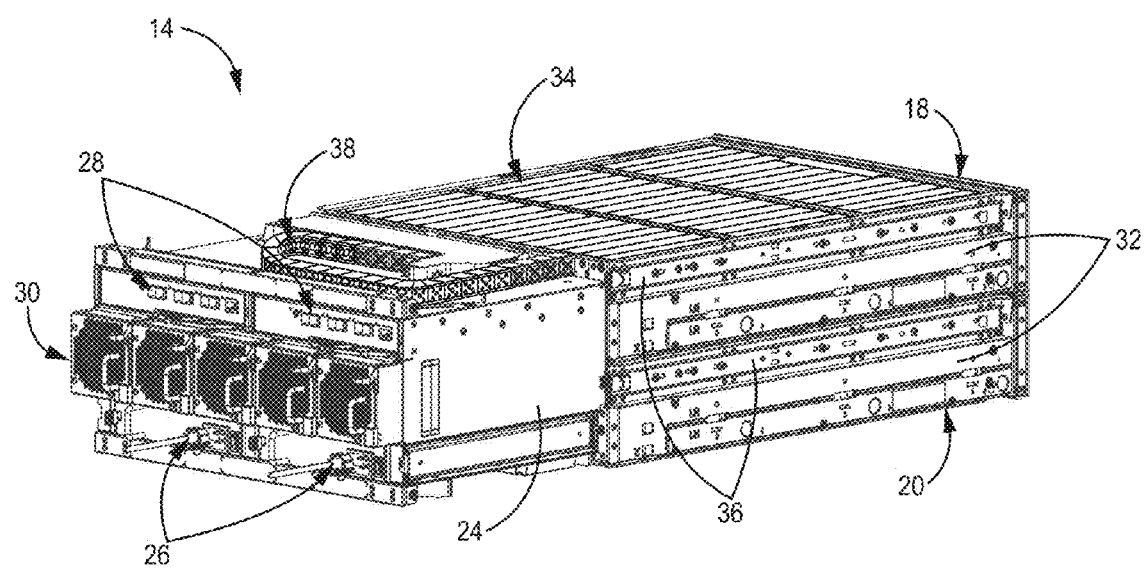
FIG. 2 is a rear-overhead, partial perspective-view of the chassis shown in FIG. 1 without the chassis housing and showing the sub-chassis and closed drawers.
Figure 3:
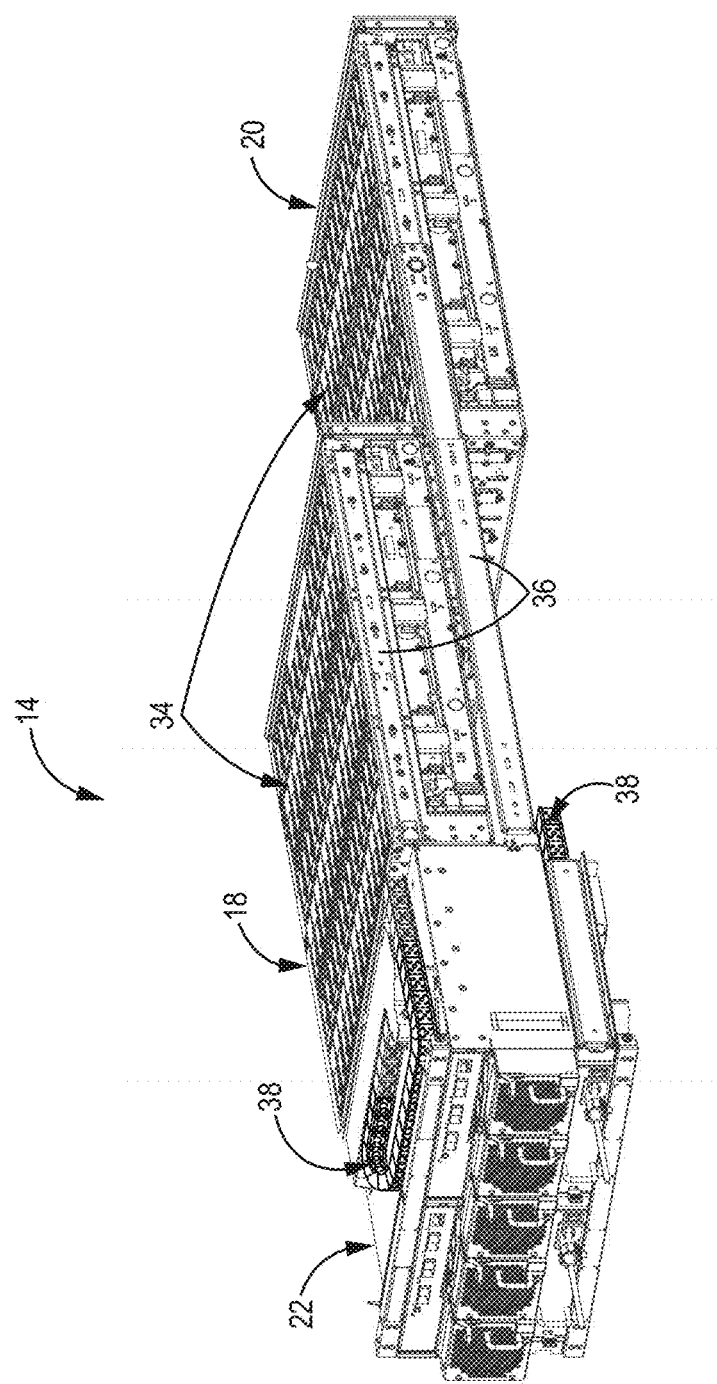
FIG. 3 is a rear-overhead perspective view of the chassis shown in FIG. 1 without the chassis housing and showing the sub-chassis and one open drawer.

Beginning with FIGS. 1, 2, and 3, a data management system 10 according to various embodiments of the present disclosure is shown including a rack 12 maintaining or supporting a chassis 14. The rack 12 may be one of a plurality of racks in a data management system 10. Each rack 12 may occupy a portion of the floor space in a data center or data room, for example, and include one or more chassis 14.

Racks 12 may also be described as cabinets and can include four metal posts, which may define a tall rectangular prism volume. In the illustrated embodiment, the chassis 14 is mounted to four posts of the rack 12. Although only one chassis 14 is shown for illustrative purposes, the rack 12 may be tall enough to mount a plurality of chassis 14 in a vertical stacking configuration.

The chassis 14 may include a chassis housing 16 extending from a front portion to a rear portion of the chassis 14, a sub-chassis 22 disposed in the rear portion of the chassis 14, and one or more drawers 18, 20 disposed in the front portion of the chassis 14. The chassis housing 16 may be coupled to the sub-chassis 22 and the drawers 18, 20. The chassis housing 16 may be formed of sheet metal, for example. In some illustrative embodiments, the sub-chassis 22 is fixedly coupled to the chassis housing 16, and the drawers 18, 20 are slidably coupled to the chassis housing 16.

The chassis 14 may be dimensioned according to standard sizes and define a limited amount of space for components. In at least one illustrative embodiment, the height of the chassis 22 is about 220 mm (5 U), the width of the chassis 14 may be a standard width of about 19 inches, and the depth of the chassis 14 may about 900 mm.

The sub-chassis 22 may include a sub-chassis frame 24 that physically maintains or supports one or more power supplies 26 to provide electrical power to components of the chassis 14, one or more data controllers 28 to manage the flow of data and data requests for the chassis 14, and one or more fans 30 to provide cooling airflow to the components of the chassis 14. In various illustrative embodiments, the power supplies 26, data controllers 28, and fans 30 are fixedly coupled to the sub-chassis frame 24.

In many data management systems 10, the sub-chassis 22 includes two or more power supplies 26, two or more data controllers 28, and two or more fans 30 to provide redundancy, which may allow for uninterrupted operation should a component fail. In at least the illustrated embodiment, two power supplies 26, two data controllers 28, and five fans 30 are included.

In many embodiments, the sub-chassis frame 24 is electrically conductive. The sub-chassis frame 24 may be formed of metal, for example.

Each data controller 28 may include a processor, such as a central processing unit (CPU), computer, logic array, or other device capable of directing data coming into or out of the chassis 14. In certain embodiments, the data controller 28 includes one or more computing devices having memory, processing, and communication hardware. The functions of the data controller 28 may be performed by hardware and/or as computer instructions on a non-transient computer readable storage medium.

The drawers 18, 20 may each include a drawer frame 32 that physically maintains or supports one or more active devices 34 powered by the power supplies 26. In various embodiments, a plurality of active devices 34 are supported in each drawer frame 32. Preferably, the active devices 34 are operably coupled to each of the power supplies 26 and each of the controllers 28 for redundancy.

In many embodiments, the drawer frame 32 is electrically conductive. The drawer frame 32 may be formed of metal, for example.

In many illustrative embodiments, the active devices 34 may be servers, storage devices, or both. Storage devices may be hard disk drives, flash drives, solid state drives, or any other device suitable for storing data, for example. Servers may be application modules or any other compute modules, which may be structured to functionally execute the operations of the server, for example. Modules may be implemented in hardware and/or as computer instructions on a non-transient computer readable storage medium, and modules may be distributed across various hardware or computer-based components.

In some illustrative embodiments, the chassis 14 may include at least 75 active devices that are disposed in each drawer frame 32. In at least one illustrative embodiment, the chassis 14 includes 84 drives or 16.8 drives per U. In one example, the chassis 14 may be capable of achieving a data bandwidth of about 12 Gigabytes per second.

As illustrated, the drawers 18, 20 may be arranged in a stacking configuration, such that one drawer 18 is disposed on top of the other drawer 20. The active devices 34 can be independently accessible from each drawer 18, 20 when opened. In many illustrative embodiments, each drawer 18, 20 may each be able to slide out, like drawer 20 as illustrated in FIG. 3, so that active devices 34 may be accessible via a top side or opening. In other embodiments (not shown), some drawers 18, 20 may not be configured to slide out, but the active devices 34 may be arranged along a front of the drawer 18, 20 to be accessible via a front side or opening.

In some illustrative embodiments, each drawer frame 32 is mechanically coupled to a slide assembly 36 to facilitate a slidable coupling with the chassis housing 16. For example, each drawer frame 32 may be coupled to one rail of a slide assembly 36, and the chassis housing 16 is coupled to another rail of the slide assembly 36. In at least one embodiment, the rails are coupled by ball bearings, for example, to form a ball-bearing slide assembly 36 and may even be lubricated with a non-conductive grease to facilitate a smooth travel when a user opens or closes a sliding drawer 18, 20. However, any suitable type of slide assemblies 36 may be used with this illustrative embodiment that allows the drawers 18, 20 to be pulled out by a user.

The chassis 14 may include a cable assembly 38 coupled between the sub-chassis 22 and at least one drawer 18, 20. As illustrated, only the cable chain 58 not the cables 60 to 65 are shown (see FIGS. 6-7). In some illustrative embodiments, two cable assemblies 38 are included, one mounted to a top-side of the sub-chassis 22 operably coupled to the top drawer 18 and one mounted to the bottom-side of the sub-chassis 22 operably coupled to the bottom drawer 20. Each cable assembly 38 may be coiled when the respective drawer 18, 20 is closed. The cable assembly 38 may straighten out as the drawer 18, 20 is opened.

In various illustrated embodiments, the height of the cable assembly 38 is limited by the height of the chassis 14. For example, the components of the sub-chassis 22 may be arranged in a stacking configuration, such that a bottom cable assembly 38, a power supply 26, a data controller 28, and a top cable assembly 29 are vertically arranged and together are limited by the height of the chassis 14. Each cable assembly 38 may provide data and power connections between the power supplies 26 and the active devices 34 in the respective drawer 18, 20. Generally, each cable assembly 38 is flexible so that connections may be maintained even as the drawers 18, 20 are opened and closed.

In various illustrative embodiments, the sub-chassis frame 24 and the drawer frame 32 form part of the return power path from the active devices 34 to the power supplies 26. However, the ball bearings and non-conductive grease may limit the ability to form a robust electrical connection with sufficient cross-sectional area to serve as a return power path there through. For example, in many embodiments, the return power path is capable of supporting at least about 100 amperes (amps) of current or at least about 200 amps of current. The cable assembly 38 may provide a return power path from the drawer frame 32 to the sub-chassis frame 24 sufficient to support the current required to power the active devices 34, which is described herein in further detail with respect to FIGS. 4 to 9.

Figure 4:
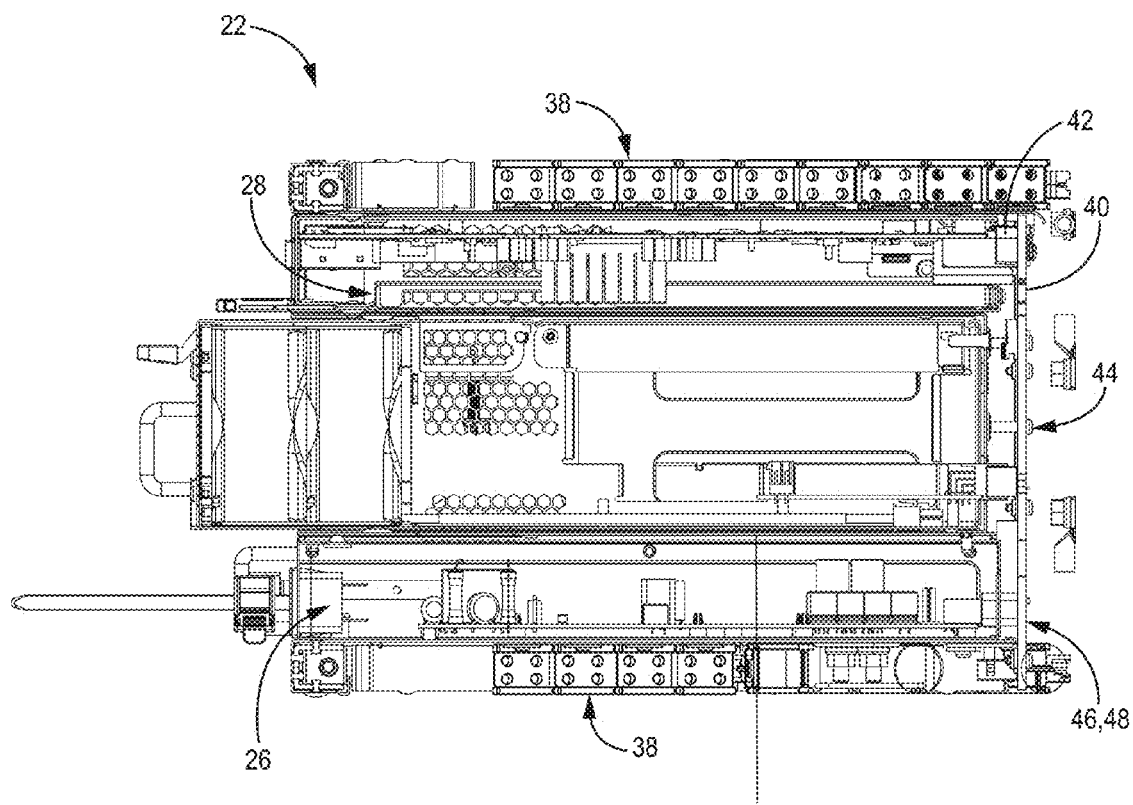
FIG. 4 is a cross-sectional elevation view of a side of the sub-chassis shown in FIGS. 2 and 3.
Figure 5:
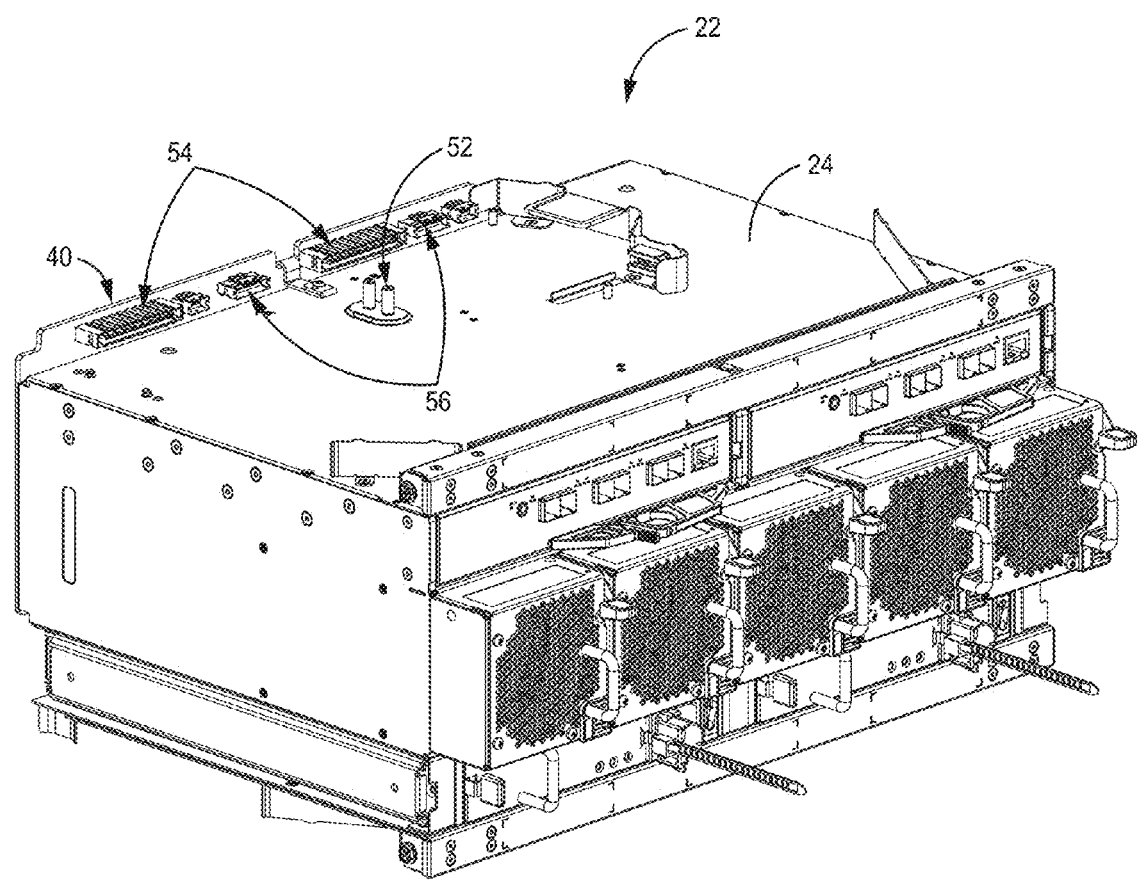
FIG. 5 is a rear-overhead perspective view of the sub-chassis shown in FIG. 4 without the cable assembly and without a portion of a sub-chassis housing.

FIGS. 4 and 5 show example connections in the sub-chassis 22 from the controllers 28 and the power supplies 26 to the cable assemblies 38 according to some illustrative embodiments. In many illustrative embodiments, the sub-chassis 22 includes a backplane 40, which may be a printed circuit board including conductors and insulators, for example. Data connections 44 may be included between the data controllers 28 and the backplane 40, and data connections 54 may be provided between the backplane 40 and the cable assembly 38.

The power supplies 26 may each include two power supply terminals 46, 48 including a first terminal 46 along a return power path and a second terminal 48 along an outgoing power path. The first terminal 46 may be electrically coupled to the backplane 40. A conductor 42 may electrically couple the backplane 40 to the sub-chassis frame 24, such as a copper pad in contact with the metalwork of the sub-chassis frame 24.

A power connection 52, which may be in the form of metal studs, for example, may electrically couple the sub-chassis frame 24 to the cable assembly 38. In many embodiments, the data connections 44, 54 and the power connection 52 is mirrored on the bottom side of the sub-chassis 22.

In many embodiments, the power supplies 26 are direct current (DC) power supplies. However, an alternating current (AC) or any suitable power supply 26 may be used with the outgoing and return power paths. In operation, the power supplies 26 drive a current via the first and second terminals 46, 48, for example, to provide electrical power to the active devices 34.

Figure 6:
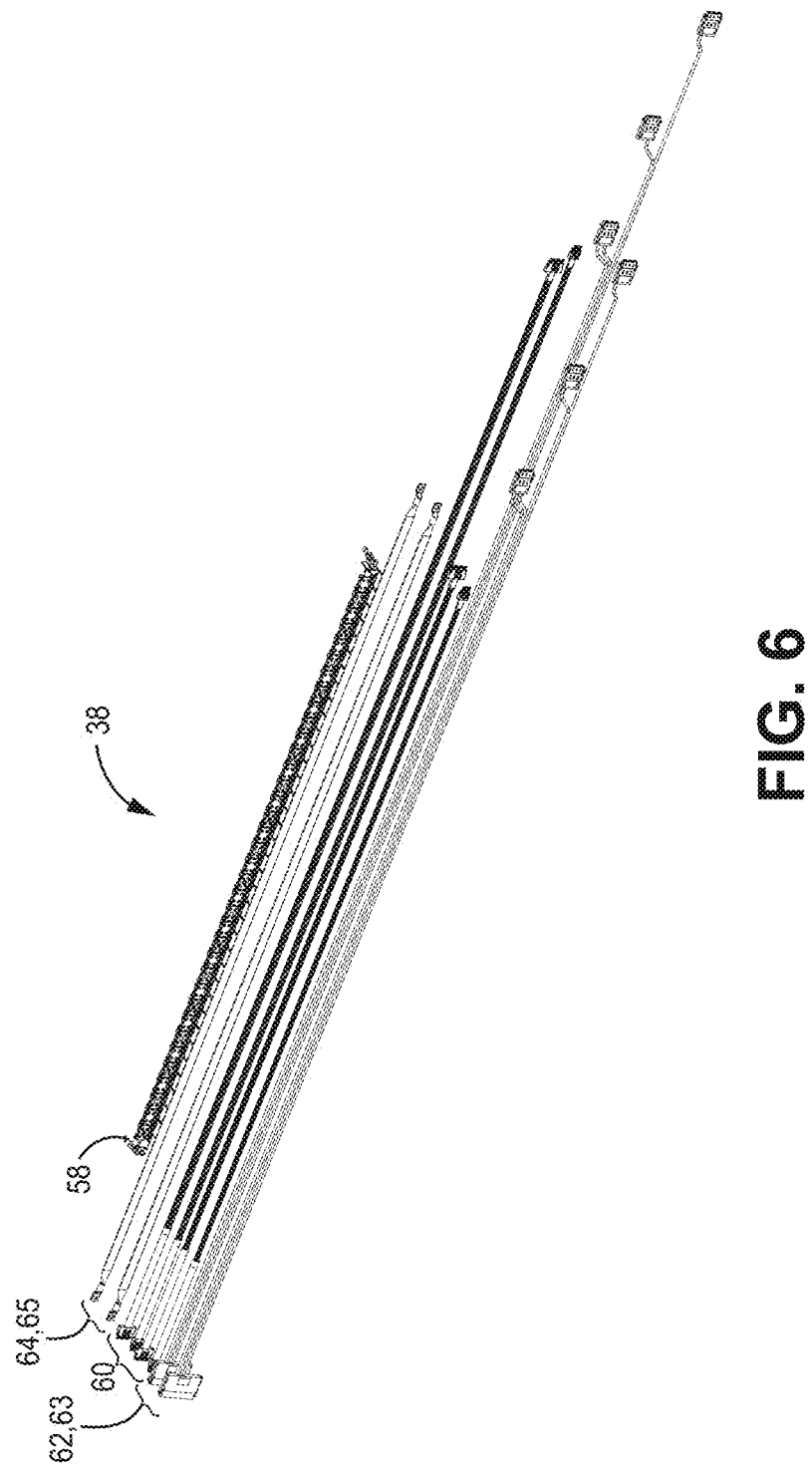
FIG. 6 is an exploded view of the cable assembly prior to installation onto the sub-chassis shown in FIG. 4.
Figure 7:
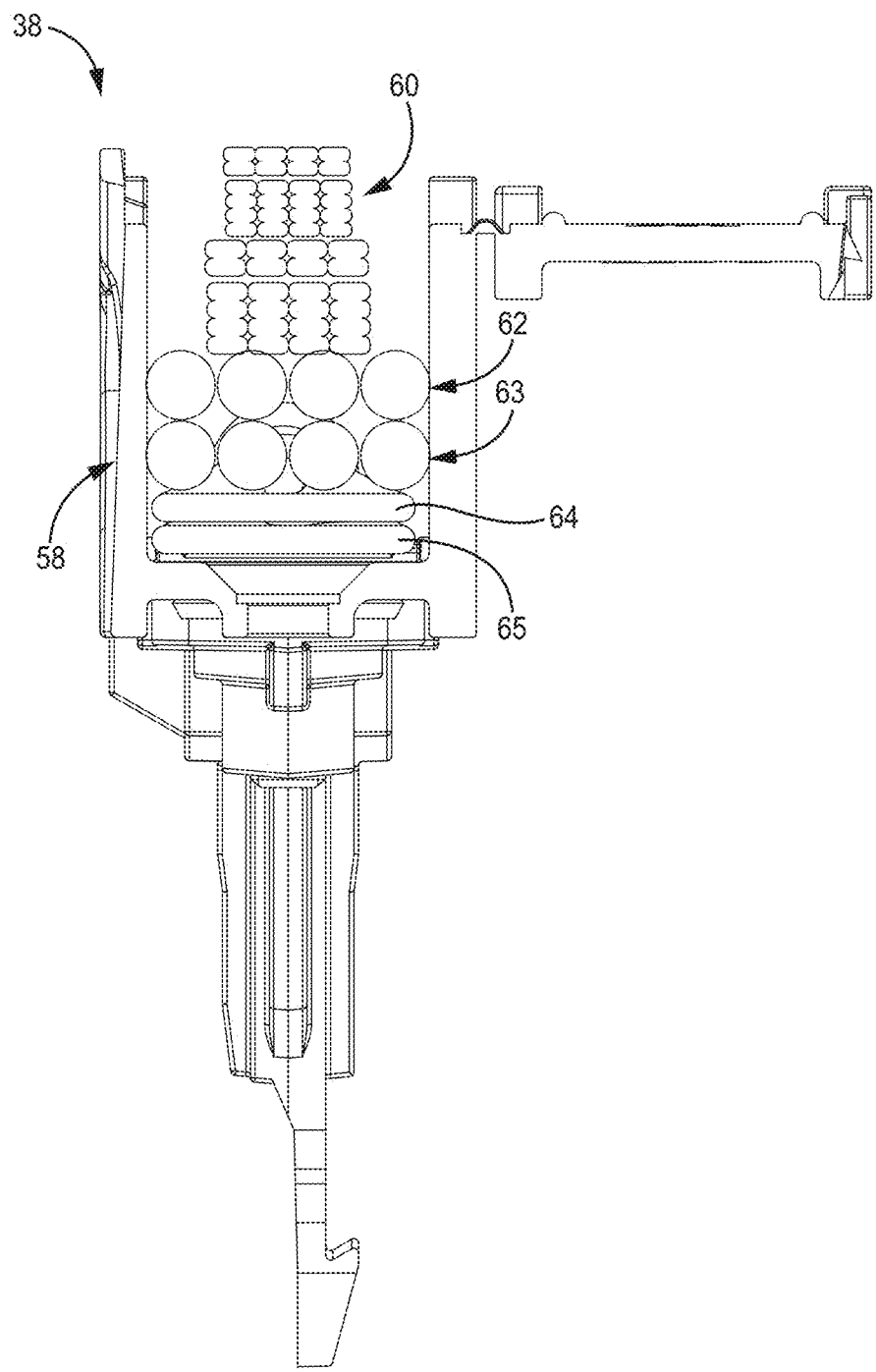
FIG. 7 is a cross-sectional elevation view across a width of the cable assembly shown in FIG. 6.

FIGS. 6 and 7 show an example cable assembly 38 according to some illustrative embodiments. As shown, the cable assembly 38 includes a cable chain 58, data cables 60, outgoing power cables 62, 63 electrically coupled to the second terminals 48 of the power supplies 26, and return power cables 64, 65 electrically coupled to the first terminal 46 of the power supplies 26. The cables 60 to 65 may include varying lengths to connect to different positions along the drawers 18, 20.

The cable chain 58 is a form of cable management including multiple segments that pivot in relation to one another to form a flexible tunnel for maintaining cables 60 to 65, which extend there through. As the drawers open and close, the cable chain 58 guides the cables 60 to 65 in an organized manner to prevent undesirable crimping or pinching in the structure of the chassis 14. Although cable management in the form of a cable chain 58 with multiple segments that pivot in relation to one another is shown, any suitable form of cable management may be used to maintain cables 60 to 65. In some illustrative embodiments, the cable chain 58 defines a flexible tunnel having a 0.5-inch by 0.5-inch cross-sectional area for receiving the cables 60 to 65.

The outgoing power cables 62, 63 may be described as a first plurality of parallel power cables 62 and a second plurality of parallel power cables 63. Each plurality of parallel power cables 62, 63 may be electrically connected to a different side of a drawer 18, 20 (e.g., a left side or a right side) and to a different power supply 26.

The return power cables 64, 65 may include a first return power cable 64 and a second return power cable 65. Each return power cable 64, 65 may be associated with one of the plurality of outgoing power cables 62, 63, and each may be electrically connected to a different side of a drawer frame 32 and to a different power supply 26. In at least the illustrated embodiment, the cable assembly 38 includes two sets of four outgoing power cables 62, 63 and one return power cable 64, 65, or a total of eight outgoing power cables 62, 63 and two return power cables 64, 65.

The outgoing power cables 62, 63 may define a conductive cross-sectional area for carrying current from the power supplies 26, for example. The return power cables 64, 65 may also define a conductive cross-sectional area for carrying current back to the power supplies 26, for example. In some illustrative embodiments, the total conductive cross-sectional area of the outgoing power cables 62, 63 and the total conductive cross-sectional area of the return power cables 64, 65 are about equal. In various embodiments, each of the power cables 62 to 65 are rated to carry about 100 amps of current during operation.

In some conventional embodiments, the return power cables 64, 65 may be insulated, like the outgoing power cables 62, 63, and the number of return power cables 64, 65 may equal the equal number of outgoing power cables 62, 63, which would result in sixteen insulated power cables. In contrast, according to various illustrative embodiments, each of the return power cables 64, 65 may be uninsulated, which may provide beneficial space-savings in the cable chain 58, for example. Because each of the return power cables 64, 65 is electrically coupled to the drawer frame 32, the return power cables 64, 65 need not be electrically isolated. The return power cables 64, 65, then, may then require less space in the cable chain 58 than comparable insulated return power cables in some conventional embodiments, while having the same conductive cross-sectional area. In certain embodiments, the return power cables 64, 65 may define a conductive cross-sectional area equal to the total cross-sectional area.

In further embodiments, the conductive cross-sectional area of the sub-chassis frame 24 and/or the drawer frame 32 may be about equal to or greater than the conductive cross-sectional area of the return power cables 64, 65. In at least some illustrative embodiments, the sub-chassis frame 24 and the drawer frame 34 have a greater conductive cross-sectional area than the return power cables 64, 65 and may define a relatively lower resistive portion of the return power path.

The cross-sectional area of the return power cables 64, 65 may be designed or calculated based on the relative cross-sectional areas of other components in the chassis 12, which may serve to minimize their cross-sectional size. In various illustrative embodiments, the cross-sectional area of the return power cables 64, 65 may be designed or calculated, based on the cross-sectional area of the drawer frame and/or the sub-chassis frame.

For example, by replacing power cabling with the sub-chassis frame 24 and the drawer frame 32 in the return power path, the resistivity of the return power path may be decreased due to those portions having a larger relative cross-sectional area for current conduction. As a result, the voltage drop along the return power path may then be decreased. In many illustrative embodiments, the conductive cross-sectional size of the outgoing power cables 62, 63 may accordingly be decreased, which may increase the resistivity while still maintaining a voltage drop at the active devices 34 within desirable limits (e.g., a minimal voltage drop). The space within the cable chain 58 due to the reduced cross-sectional size of the cabling 62 to 65 may be used to add additional data cables 60, for example, to increase the data bandwidth of the chassis 12. In some illustrative embodiments, twice the number of data cables 60 may be included in the same cable chain 58 compared to some conventional embodiments, and the data bandwidth per active device 34 may be increased by about double (e.g., 6 Gb/s to 12 Gb/s) using this technique.

In many embodiments, the return power cables 64, 65 may be in the form of a cable braid disposed in a flat configuration (e.g., as a flattened braided tube) when assembled in the cable chain 58. However, in other embodiments, another suitable form of conductor may be used, such as a solid conductor.

With the cable assemblies 58 bringing data and power connections from the sub-chassis 22, the drawers 18, 20 are preferably configured to direct the data and power to and from the various active devices 34. In general, each operable connection to an active device 34 described herein may be doubled in number for redundancy.

Figure 8:
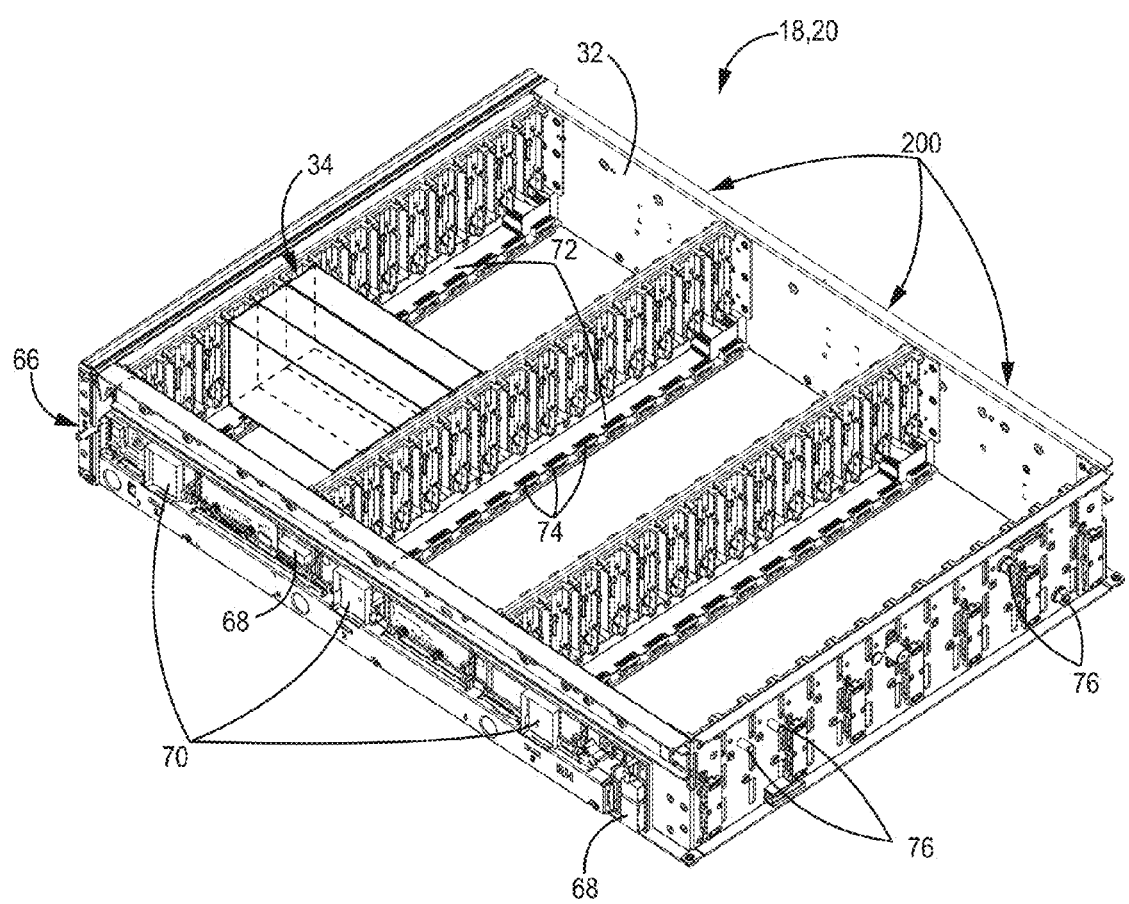
FIG. 8 is a rear-overhead perspective view of one drawer shown in FIG. 1.

Turning to FIG. 8, in various illustrative embodiments, each of the drawers 18, 20 includes at least one sideplane 66 having data connections 68 coupled to the data cables 60 and outgoing power connections 70 coupled to the outgoing power cables 62, 63 to receive electrical power from the power supplies 26. The drawers 18, 20 may also each include baseplanes 72 having base connectors 74 mechanically and electrically coupled to the active devices 34, which may be arranged into rows 200. The sideplanes 66 and baseplanes 72 may include printed circuit boards. Each drawer frame 32 may also include return power connections 76 mechanically and electrically coupled to the return power cables 64, 65.

The sideplane 66 may be fixedly coupled to the drawer frame 32. In at least the illustrated embodiment, each drawer 18, 20 includes two sideplanes 66 each associated with a different side of the drawer (e.g., a left side or a right side) and to a different power supply 26. Each cable 60 to 65 in the cable assembly 38 may also be associated with one of the sideplanes 66.

The active devices 34 may be coupled to the data controllers 28 via the sideplanes 66. Each sideplane 66 may be configured to expand a number of possible connections from a data controller 28. For example, each sideplane 66 may include an expander device, which is capable of selectively connecting one data controller 28 to any one, some, or all of the active devices 34 in one drawer 18, 2, which may add flexibility to the chassis 12 for data management. Each base connector 74 may include at least one data connection between the active device 34 and the sideplane 66. Each sideplane 66 may be capable of handling about 48 Gb/s in some embodiments.

Each active device 34 may include at least two power terminals. Each power terminal may be coupled to a base connector 74, which may include at least two conductors. One power terminal of each active device 34 may be electrically coupled to one conductor of the base connector 74, which is electrically coupled to a power connection 70 of the sideplane 66. Another power terminal of each active device 34 may be electrically coupled to another conductor of the base connector 74, which is electrically coupled to the drawer frame 34, for example, by a copper pad in contact with the metalwork of the drawer frame 34.

Each drawer 18, 20 may include a plurality of rows 200. As illustrated, three rows 200 may be included in each drawer 18, 20, each corresponding to two baseplanes 72. Each row 200 may share the same outgoing power connection 70 via the respective baseplanes 72 and be associated with one outgoing power cable from each plurality of parallel power cables 62, 63.

Each sideplane 66 may include four outgoing power connections 70. Three of the outgoing power connections 70 may be associated with the rows 200 and the fourth outgoing power connection 70 may be associated with powering components (such as the expander) on the sideplane 66.

Each of the active devices 34 may be operably coupled to each of the sideplanes 66 via the respective baseplane 72 in each row 200. In other words, each active device 34 may include two sets of power connections and two sets of data connections, one for each sideplane 72 via the respective baseplane 72. In many embodiments, each active device 34 is electrically coupled to both power supplies 26 and to both data controllers 28 for redundancy.

The return power connections 76 may be disposed on a rear side of the drawers 18, 20. In the illustrated embodiment, each drawer 18, 20 includes at least two return power connections 76. Half of the return power connections 76 may be associated with each side (e.g., the left side and right side) and coupled to a respective return power cable 64, 65. In many illustrative embodiments, all of the power connections 76 are electrically coupled.

Figure 9:
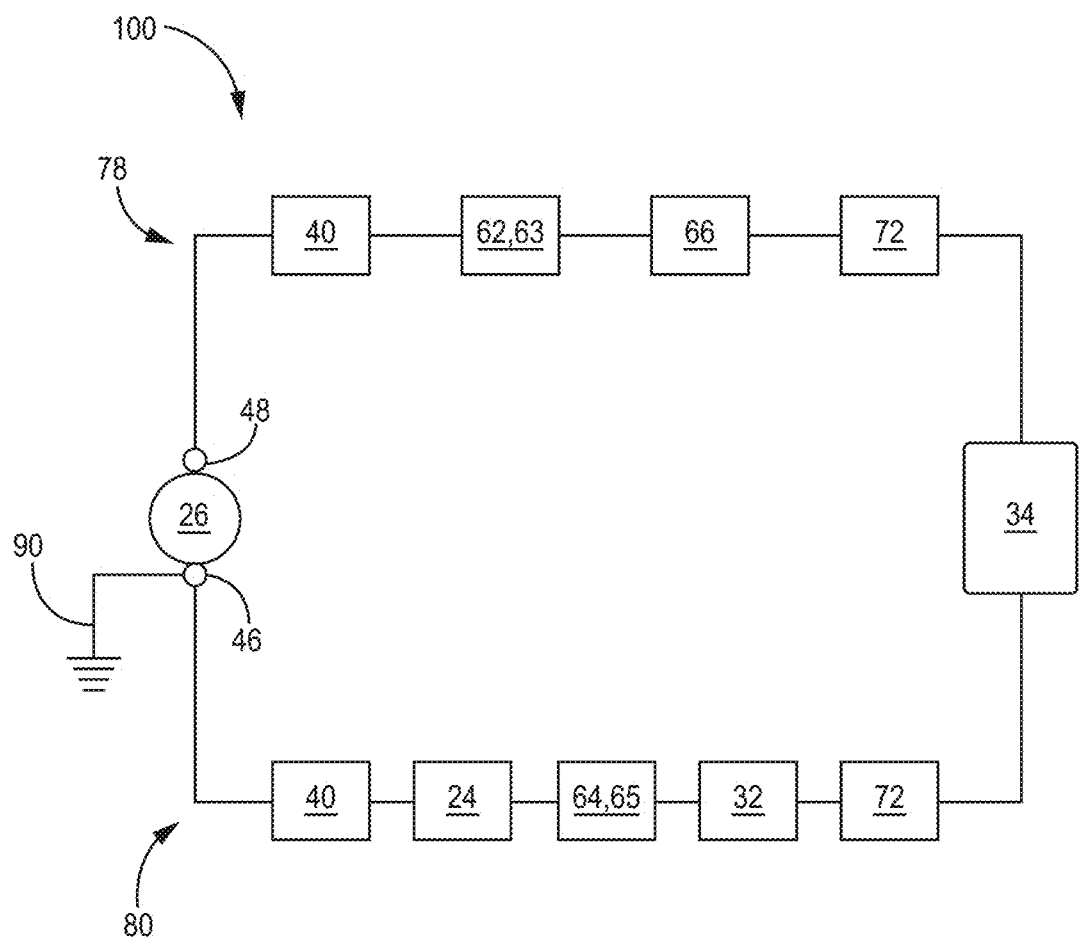
FIG. 9 is a schematic representation of a power circuit for the chassis shown in FIG. 1.

With the structure of at least some illustrative embodiments being described, FIG. 9 shows a schematic representation of the components forming a power delivery circuit 100, which includes an outgoing branch 78 and a return branch 80. Each of the components along the branches 78, 80 are operably coupled to conduct current and deliver power from the power supply 26 to the active device 34. In the illustrated embodiment, the outgoing branch 78 includes the second terminal 48 of the power supply 26, the backplane 40, outgoing power cables 62, 63, a sideplane 66, a baseplane 72, and one terminal of one or more active devices 34. Also, in the illustrated embodiment, the return branch 80 includes the baseplane 72, the drawer frame 32, at least one return power cable 64, 65, the sub-chassis frame 24, the backplane 40, and the first terminal 46 of the power supply 26.

Optionally, the first terminal 46 of the power supply 26 may also be electrically coupled to an earth ground 90. The earth ground 90 provides a path for excess current and may also facilitate electromagnetic shielding.

In other embodiments without a slidable drawer (not shown), the return power path 80 may include the chassis housing 16 instead of the return power cables 64, 65. In such embodiments, a return power cable 64, 65 may not be needed.

Thus, embodiments of the STRUCTURAL ELECTRICAL GROUNDING FOR DATA MANAGEMENT SYSTEMS are disclosed. All references and publications cited herein are expressly incorporated herein by reference in their entirety into this disclosure, except to the extent they may directly contradict this disclosure.

In the preceding description, reference is made to the accompanying set of drawings that form a part hereof and in which are shown by way of illustration several specific embodiments. It is to be understood that other embodiments are contemplated and may be made without departing from (e.g., still falling within) the scope or spirit of the present disclosure. The preceding detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range. Herein, the terms "up to" or "no greater than" a number (e.g., up to 50) includes the number (e.g., 50), and the term "no less than" a number (e.g., no less than 5) includes the number (e.g., 5).

As used herein, "have", "having", "include", "including", "comprise", "comprising" or the like are used in their open ended sense, and generally mean "including, but not limited to". It will be understood that "consisting essentially of", "consisting of", and the like are subsumed in "comprising," and the like.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The term "and/or" means one or all of the listed elements or a combination of any two or more of the listed elements (e.g., casting and/or treating an alloy means casting, treating, or both casting and treating the alloy).

The phrases "at least one of," "comprises at least one of," and "one or more of" followed by a list refers to any one of the items in the list and any combination of two or more items in the list.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

The words "preferred" and "preferably" refer to embodiments of the disclosure that may afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the disclosure.

Terms related to orientation, such as "top", "bottom", "side", and "end", are used to describe relative positions of components and are not meant to limit the orientation of the embodiments contemplated. For example, an embodiment described as having a "top" and "bottom" also encompasses embodiments thereof rotated in various directions unless the content clearly dictates otherwise.

The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A system comprising:
   a sub-chassis comprising an electrically-conductive sub-chassis frame;
   a drawer frame being electrically conductive and mechanically coupled to the sub-chassis;
   a first power supply fixedly coupled relative to the sub-chassis and comprising a first terminal and a second terminal, the first power supply configured to drive a current via the first and second terminals to provide electrical power to an active device disposed in the drawer frame; and
   a first power cable being electrically coupled to the first terminal of the first power supply via the sub-chassis frame and being electrically coupled to the active device via the drawer frame.

2. The system of claim 1, further comprising a plurality of active devices disposed in the drawer frame and operably coupled to be powered by the first power supply, wherein each of the plurality of active devices is electrically coupled to the first power cable.

3. The system of claim 2, wherein the plurality of active devices are arranged in a plurality of rows, each row associated with a different one of a first plurality of parallel power cables such that the active devices in one row are electrically coupled to the second terminal of the first power supply via one of the first plurality of parallel power cables to receive electrical power.

4. The system of claim 1, further comprising a sideplane fixedly coupled to the drawer frame, the sideplane being configured to expand a number of possible connections from a data controller disposed in the sub-chassis, the sideplane being electrically coupled to the first terminal of the power supply via the drawer frame and electrically coupled to the second terminal of the first power supply via one of the first plurality of parallel power cables to receive electrical power from the first power supply.

5. The system of claim 1, further comprising at least one of a fan, a processor, and a data controller disposed in the sub-chassis frame and electrically coupled to be powered by the first power supply.

6. The system of claim 1, wherein the drawer frame is slidably coupled to a chassis housing coupled to the sub-chassis.

7. The system of claim 6, wherein the drawer frame and the sub-chassis are slidably coupled by a ball-bearing slide assembly.

8. The system of claim 1, further comprising a second power supply mechanically coupled to the sub-chassis, and further comprising a second power cable and a second plurality of parallel power cables, wherein the second power cable is electrically coupled to the first terminal of the second power supply and the second plurality of parallel power cables are electrically coupled to the second terminal of the second power supply.

9. The system of claim 8, further comprising another drawer frame coupled to the sub-chassis frame, wherein the height of each drawer frame is less than or equal to half a height of the sub-chassis, wherein the another drawer frame is electrically coupled to the first terminal of the first and second power supplies via a set of power cables different than the first and second power cables and different than the first and second pluralities of parallel power cables.

10. The system of claim 1, wherein a height of the sub-chassis is about 220 mm and at least 75 active devices are disposed in the drawer frame and electrically coupled to the first power supply.

11. The system of claim 1, wherein the second terminal of the first power supply is electrically coupled to an earth ground.

12. The system of claim 1, wherein the cable assembly further comprises a cable chain and a first plurality of data cables extending through the cable chain, wherein the first power cable and the first plurality of power cables extend through the cable chain.

13. The system of claim 12, wherein the cross-sectional area of the first power cable is calculated in response to the cross-sectional area of at least one of the drawer frame and the sub-chassis frame.

14. A system comprising:
   an active device comprising a first power connection and a second power connection;
   a drawer frame being electrically conductive and electrically coupled to the first power connection of the active device at a first connection on the drawer frame;
   a first power cable being electrically coupled to the drawer frame at a second connection on the drawer frame different than the first connection;
   a sub-chassis comprising an electrically-conductive sub-chassis frame electrically coupled to the power cable and a backplane comprising a backplane electrical conductor electrically coupled to the sub-chassis frame; and
   a power supply comprising a first terminal and a second terminal to deliver electrical power, the first terminal being electrically coupled to the backplane electrical conductor and a second terminal, the second terminal being electrically coupled to the second power connection of the active device.

15. The system of claim 14, wherein the active device is one of a server and a storage device to be electrically powered by the power supply.

16. The system of claim 14, further comprising a base connector electrically coupled between the first power connection of the active device and the drawer frame.

17. The system of claim 14, further comprising a sideplane electrically coupled between the second terminal of the power supply and the second power connection of the active device.

18. The system of claim 14, wherein the power cable is uninsulated.

* * * * *